United States Patent [19]

Hankui

[11] Patent Number: 5,789,929
[45] Date of Patent: Aug. 4, 1998

[54] METHOD AND DEVICE FOR MEASURING THE SPECIFIC ABSORPTION RATE OF ELECTRIC POWER IN A SIMULATED HUMAN BODY

[75] Inventor: Eiji Hankui, Tokyo, Japan

[73] Assignee: NEC Corporation, Tokyo, Japan

[21] Appl. No.: 766,964

[22] Filed: Dec. 16, 1996

[30] Foreign Application Priority Data

Dec. 15, 1995 [JP] Japan ................... 7-327029

[51] Int. Cl.$^6$ .................. G01N 22/00; G01R 29/08; G01R 33/02
[52] U.S. Cl. .................. 324/642; 324/225; 324/247; 324/260
[58] Field of Search .................. 324/95, 202, 225, 324/243, 244, 247, 258, 260, 637, 638, 642, 646; 128/653.1; 340/600; 600/407, 409

[56] References Cited

U.S. PATENT DOCUMENTS 5,610,519  3/1997  Hankui et al. .................. 324/244 X

FOREIGN PATENT DOCUMENTS

| 0 702 932 | 3/1997 | European Pat. Off. . |
| 8-94544 | 4/1996 | Japan . |
| WO 89/04632 | 6/1989 | WIPO . |
| WO 95/03549 | 2/1995 | WIPO . |

OTHER PUBLICATIONS

Kuster et al., "Energy Absorption Mechanism by Biological Bodies in the Near Field of Dipole Antennas Above 300 MHz", *IEEE Transactions on Vehicular Technology*, vol. 41, No. 1, Feb. 1992, pp. 17–23.

J.D. Dyson, "Measurement of Near Fields of Antennas and Scatters", *IEEE Transactions on Antennas and Propagation*, vol. AP-21, No. 4, Jul. 1973, pp. 446–460.

*Primary Examiner*—Gerard R. Strecker
*Attorney, Agent, or Firm*—Sughrue, Mion, Zinn, Macpeak & Seas, PLLC

[57] ABSTRACT

A measuring method of the SAR is provided, which makes it possible to measure the SAR on the surface of a human body with high accuracy when the human body is approached to an antenna. After a probe for receiving at least one of two orthogonally-intersecting magnetic fields is prepared, a simulated biological body having approximately the same dielectric constant and approximately the same permeability as those of a human body is placed at a wanted point. A first magnetic field radiated from an antenna and a second magnetic field generated by reflection of the first magnetic field on the surface of the simulated biological body are separately measured at different measuring points by using the probe. A compensated magnetic field is calculated using the measured values of the first and second magnetic fields. A current distribution of the antenna is calculated by using the calculated values of the compensated magnetic field. The strength of an incident magnetic field on the surface of the simulated biological body is calculated by using the calculated current distribution of the antenna. The SAR is evaluated by using the calculated value of the strength of the incident magnetic field and a distance between the antenna and the simulated biological body.

9 Claims, 16 Drawing Sheets

F I G. 10
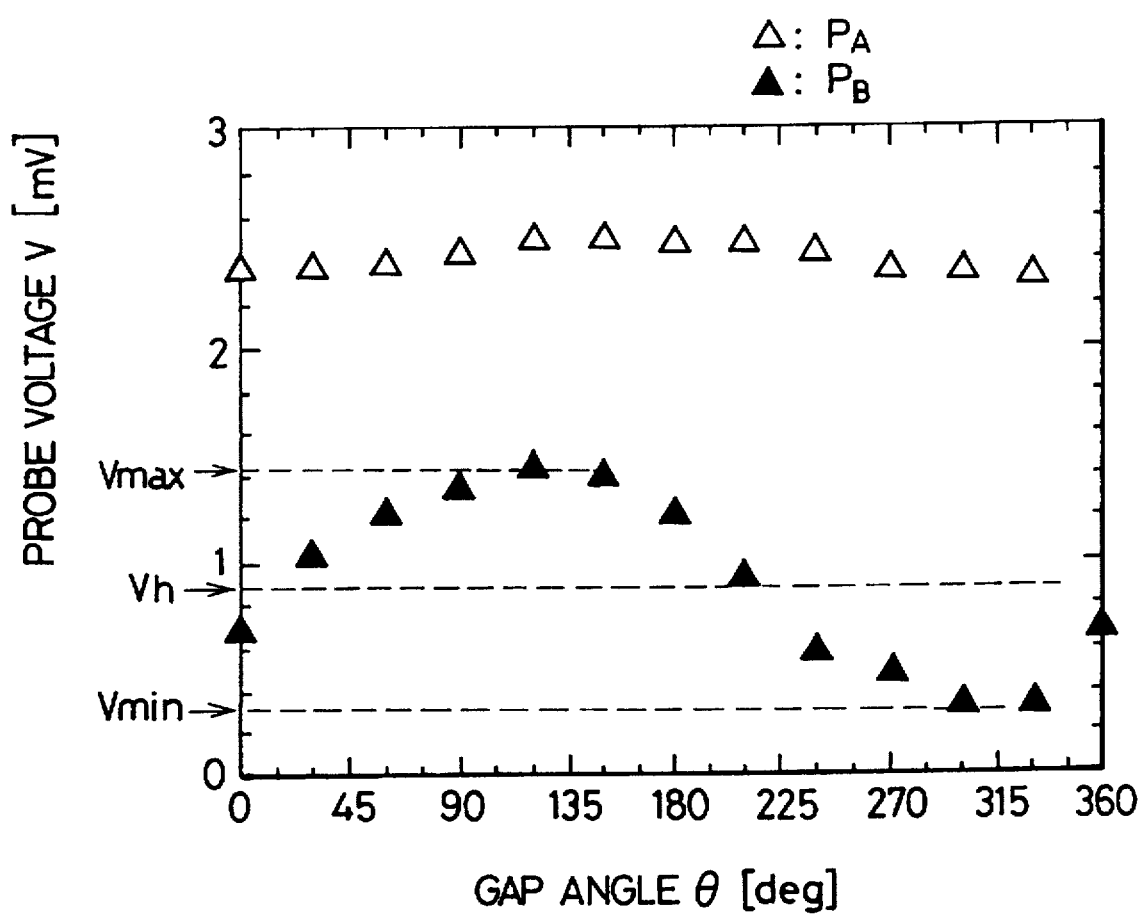

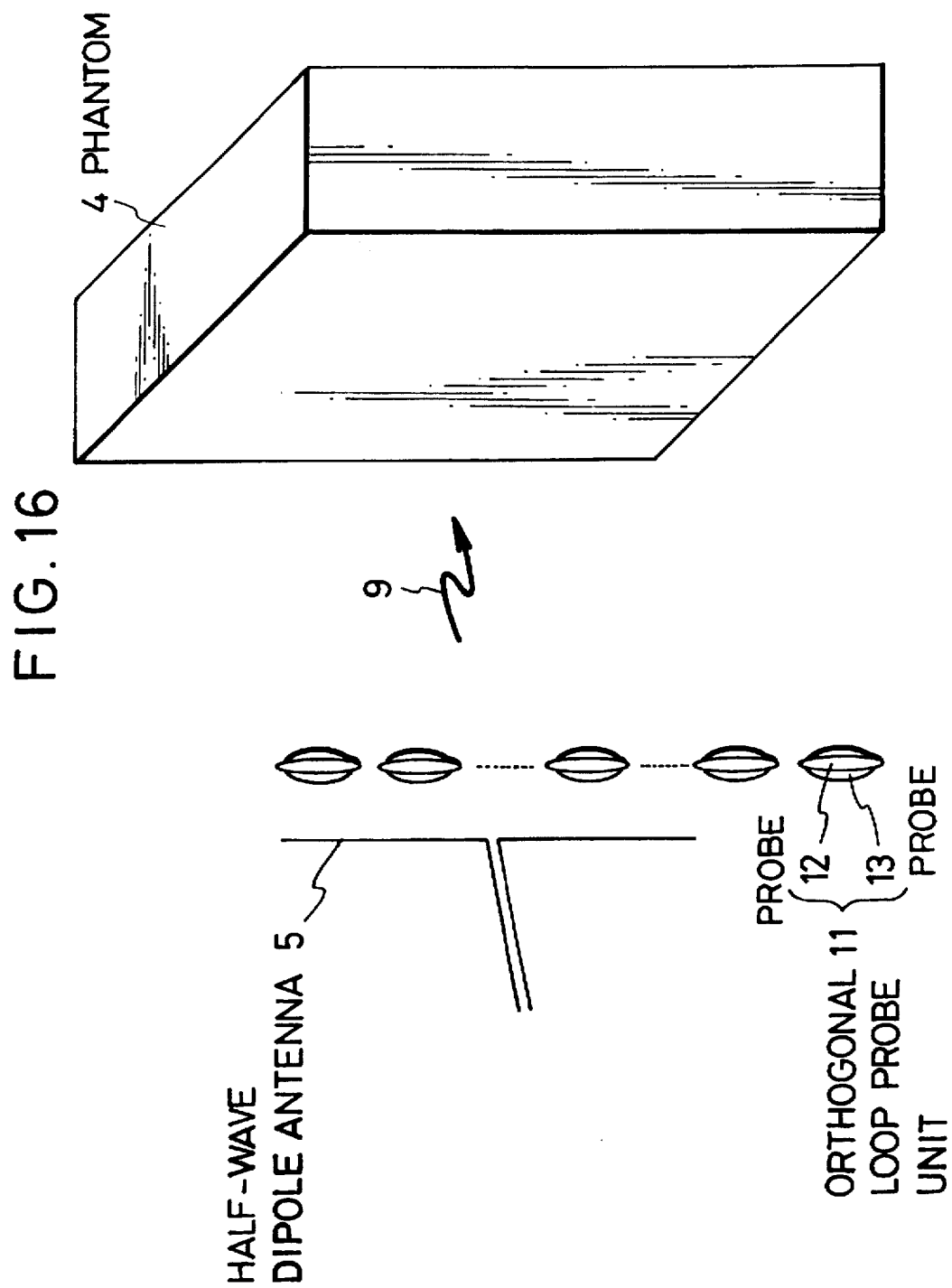

METHOD AND DEVICE FOR MEASURING THE SPECIFIC ABSORPTION RATE OF ELECTRIC POWER IN A SIMULATED HUMAN BODY

BACKGROUND OF THE INVENTION

1. Field of the Invention

The present invention relates to a measuring method and device of the Specific Absorption Rate (SAR) of electric power and more particularly, to a measuring method and device of the SAR for communication equipment such as portable telephones.

2. Description of the Prior Art

In recent years, with rapid popularization of the communication equipment such as portable telephones, SAR evaluation of the human boy has been demanded. The SAR is defined as an absorbed electric power per unit mass of a human body when the human body is exposed to an electromagnetic wave. The guide-line values were disclosed in such documents as the "Guide-line for Guarding Human Bodies in Radio Wave Utilization" reported by the Telecommunications Technology Council of the Ministry of Posts and Telecommunications.

For SAR evaluation, a phantom (or, simulated biological body) having basically the same dielectric constant and permeability as those of the human body is generally used.

Conventionally, SAR evaluating methods in which the SAR is estimated from the incident magnetic field on the surface of the phantom have been reported. An example of the conventional methods of this sort was disclosed by N. Kuster and Q. Balzano in IEEE Transactions on Vehicular Technology, Vol. 41, No. 1, February 1992, pp. 17–23.

With the conventional SAR evaluating method, the SAR value is obtained by the following way:

As shown in FIG. 1, when a half-wave dipole antenna 205 radiates an electromagnetic wave 209, the surface SAR can be expressed by the following equation (1) with the use of an incident magnetic field Hi on the surface of a phantom 204

$$SAR = K \cdot H_i^2 \quad (1)$$

where K is a constant consisting of specific dielectric constant, conductivity, mass density, angular frequency, etc.

The incident magnetic field $H_i$ can be found from a current of the antenna 205 by calculation. Specifically, assuming that the current of the antenna 205 at its feeding point is defined as I and has a half-wave distribution, the maximum value $H_{imax}$ of a magnetic field impinging on the surface of the phantom 204 can be expressed by the following equation (2)

$$H_{imax} = \frac{I}{2\pi d} \quad (2)$$

where d is the distance between the half-wave dipole antenna 205 and the phantom 204.

Therefore, the maximum value $SAR_{max}$ of the SAR can be expressed by the following equation (3), which is given by substituting the equation (2) into the equation (1).

$$SAR_{max} = K \cdot \left( \frac{I}{2\pi d} \right)^2 \quad (3)$$

The current I of the antenna 205 at its feeding point is obtained by measuring a radiated magnetic field $H_f$ from the antenna 205 with the use of a loop probe 1 placed in the vicinity of the feeding point, as shown in FIG. 1.

If the distance from the feeding point to the probe 201 is defined as t, the antenna current I is expressed as the following equation (4).

$$I = 2\pi t \cdot H_f \quad (4)$$

Thus, with the conventional SAR measuring method, as shown in the flowchart in FIG. 2, first, the radiated magnetic-field $H_f$ in the vicinity of the feeding point of the antenna 205 is measured with the use of the loop probe 201 placed in the vicinity of the feeding point (step 241). Then, the current I of the antenna 205 at the feeding point is measured on the basis of the equation (4) (step 242). Using the current I thus obtained, the maximum incident magnetic field $H_{imax}$ of the phantom 204 is calculated with the use of the equation (2) (step 243). Finally, the maximum SAR value $SAR_{max}$ is calculated by using the equation (3), thereby evaluating the SAR (step 244).

However, the conventional SAR measuring method has the following problem.

When the phantom 204 (or, a human body or other dielectric having an irregular geometry) approaches the antenna 205, the magnetic wave 209 irradiated from the antenna 205 onto the phantom 204 causes an induced current to flow in the phantom 204, thereby radiating an electromagnetic wave 210. The electromagnetic wave 210 thus radiated from the phantom 204 is then applied to the antenna 205. This phenomenon has been termed the "secondary radiation" or "mutual coupling". Due to this phenomenon, the distribution of the current I of the antenna 205 changes compared with that of the case where the phantom 204 is not approached.

As a result, with the conventional SAR measuring method, the maximum SAR value $SAR_{max}$ when a human body approaches cannot be known accurately.

SUMMARY OF THE INVENTION

Accordingly, an object of the present invention is to provide a measuring method and a measuring device of the SAR that makes it possible to measure the SAR on the surface of a human body with high accuracy when the human body is approached to an antenna.

The above object together with others not specifically mentioned will become clear to those skilled in the art from the following description.

According to a first aspect of the present invention, a measuring method of the SAR is provided, which comprises the following steps.

A first step is to prepare a probe for receiving at least one of two orthogonally-intersecting magnetic fields.

A second step is to place a simulated biological body having approximately the same dielectric constant and approximately the same permeability as those of a human body at a wanted point.

A third step is to separately measure a first magnetic field radiated from an antenna and a second magnetic field generated by reflection of the first magnetic field on the surface of the simulated biological body at different measuring points by using the probe.

A fourth step is to calculate a compensated magnetic field using the measured values of the first and second magnetic fields in the third step.

A fifth step is to calculate a current distribution of the antenna by using the calculated values of the compensated magnetic field.

A sixth step is to calculate the strength of an incident magnetic field on the surface of the simulated biological body by using the calculated current distribution of the antenna.

A seventh step is to evaluate the SAR using the calculated value of the strength of the incident magnetic field and a distance between the antenna and the simulated biological body.

With the measuring method according to the first aspect of the invention, since the probe is able to receive at least one of the two orthogonally-intersecting magnetic fields, the first magnetic field radiated from the antenna and the second magnetic field generated by reflection of the first magnetic field on the surface of the simulated biological body can be separately measured at the different measuring points. Therefore, the compensated magnetic field can be calculated by using the measured values of the first and second magnetic fields.

Further, by using the calculated values of the compensated magnetic field, the current distribution of the antenna is then calculated. By using the calculated value of the current distribution of the antenna, the strength of the incident magnetic field on the surface of the simulated biological body is then calculated.

Accordingly, the SAR on the surface of a human body is able to be measured with high accuracy when the human body is approached to the antenna.

In a preferred embodiment of the measuring method according to the first aspect, the current distribution of the antenna is calculated in the fifth step by the following way.

It is assumed that the antenna comprises a plurality of segments serving as minute electric dipoles, and that the current of the antenna is equivalent to the combination of dipole currents flowing through the plurality of segments. The dipole currents are calculated by using the calculated values of the compensated magnetic field, thereby obtaining the current distribution of the antenna.

In another preferred embodiment of the measuring method, the probe is a loop probe having a looped receiving member for receiving the first and second magnetic fields and an elongated supporting member for supporting the receiving member. The receiving member has a gap. The angle between the receiving member and the supporting member is approximately 90°. The receiver member can be turned around the center of the looped receiving member.

In still another preferred embodiment of the measuring method, the probe is a unit including a first looped receiving member for receiving the first magnetic field and a second looped receiving member for receiving the second magnetic field. The angle between the first and second receiving members is approximately 90°.

In this embodiment, an advantage that the first and second magnetic fields can be readily measured occurs.

In a further preferred embodiment of the measuring method, the magnetic field probe is an array of probe units arranged along a straight line. Each of the probe units includes a first looped receiving member for receiving the first magnetic field and a second looped receiving member for receiving the second magnetic field. The angle between the first and second receiving members is approximately 90°.

In this embodiment, an advantage that the first and second magnetic fields can be simultaneously measured at different points occurs.

According to a second aspect of the present invention, a measuring device of the SAR is provided, which comprises a probe for receiving at least one of two orthogonally-intersecting magnetic fields, and a signal processor.

The probe serves to separately measure a first magnetic field radiated from an antenna and a second magnetic field generated by reflection of the first magnetic field on the surface of a simulated biological body, thereby outputting first and second output signals. The first output signal corresponds to the first magnetic field and the second output signal corresponds to the second magnetic field.

The signal processor has functions of receiving the first and second output signals to calculate a compensated magnetic field using the measured values of the first and second magnetic fields, of calculating a current distribution of the antenna using the calculated values of the compensated magnetic field, of calculating the strength of an incident magnetic field on the surface of the simulated biological body by using the calculated current distribution of the antenna, and of evaluating the SAR using the calculated value of the strength of the incident magnetic field and a distance between the antenna and the simulated biological body.

With the measuring device according to the second aspect of the invention, the first magnetic field radiated from the antenna and the second magnetic field generated by reflection of the first magnetic field on the surface of the simulated biological body can be separately measured by using the probe. Also, the processor is able to calculate the compensated magnetic field, the current distribution of the antenna, and the strength of the incident magnetic field by using the measured values of the first and second magnetic fields.

Accordingly, with the measuring device according to the second aspect, the SAR on the surface of a human body is able to be measured with high accuracy when the human body is in the vicinity of the antenna.

In a preferred embodiment of the measuring device according to the present invention, the probe is a loop probe having a looped receiving member for receiving the first and second magnetic fields and an elongated supporting member for supporting the receiving member. The receiving member has a gap. The angle between the receiving member and the supporting member is approximately 90°. The receiving member can be turned around the center of the looped receiving member.

In another preferred embodiment of the measuring device, the probe is a unit including a first looped receiving member for receiving the first magnetic field and a second looped receiving member for receiving the second magnetic field. The angle between the first and second receiving members is approximately 90°.

In this embodiment, an advantage that the first and second magnetic fields can be readily measured occurs.

In still another preferred embodiment of the measuring device, the probe is an array of units arranged along a straight line. Each of the units includes a first looped receiving member for receiving the first magnetic field and a second looped receiving member for receiving the second magnetic field. The angle between the first and second receiving members is approximately 90°.

In this embodiment, an advantage that the first and second magnetic fields can be simultaneously measured at different points occurs.

BRIEF DESCRIPTION OF THE DRAWINGS

In order that the present invention may be readily carried into effect, it will now be described with reference to the accompanying drawings.

FIG. 10 is a graph showing the relationship between the gap angle of the loop probe and the probe voltage in the measuring method according to the first embodiment.

FIG. 16 is a schematic perspective view showing a measuring method of the SAR according to a second embodiment of the present invention.

DETAILED DESCRIPTION OF THE PREFERRED EMBODIMENTS

Figure 1:
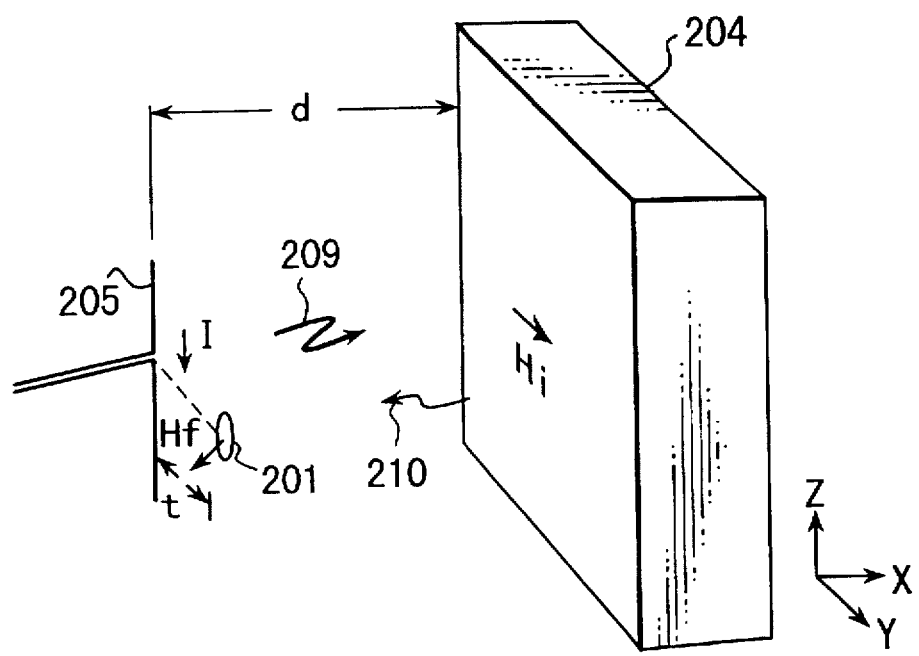
FIG. 1 is a schematic perspective view showing a conventional measuring method of the SAR.
Figure 2:
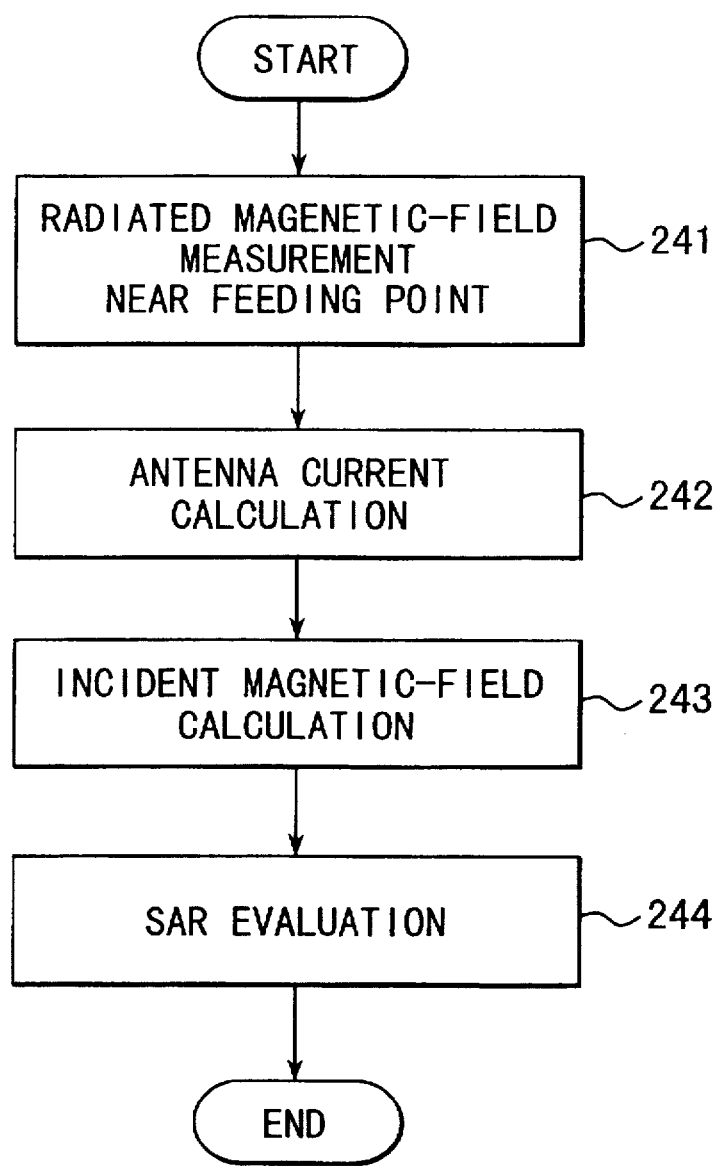
FIG. 2 is a flowchart showing the conventional measuring method of the SAR.

Preferred embodiments of the present invention will be described in detail below while referring to the drawings attached.

FIRST EMBODIMENT

A measuring method of the SAR according to a first embodiment of the present invention is shown in FIGS. 3 to 15.

Figure 3:
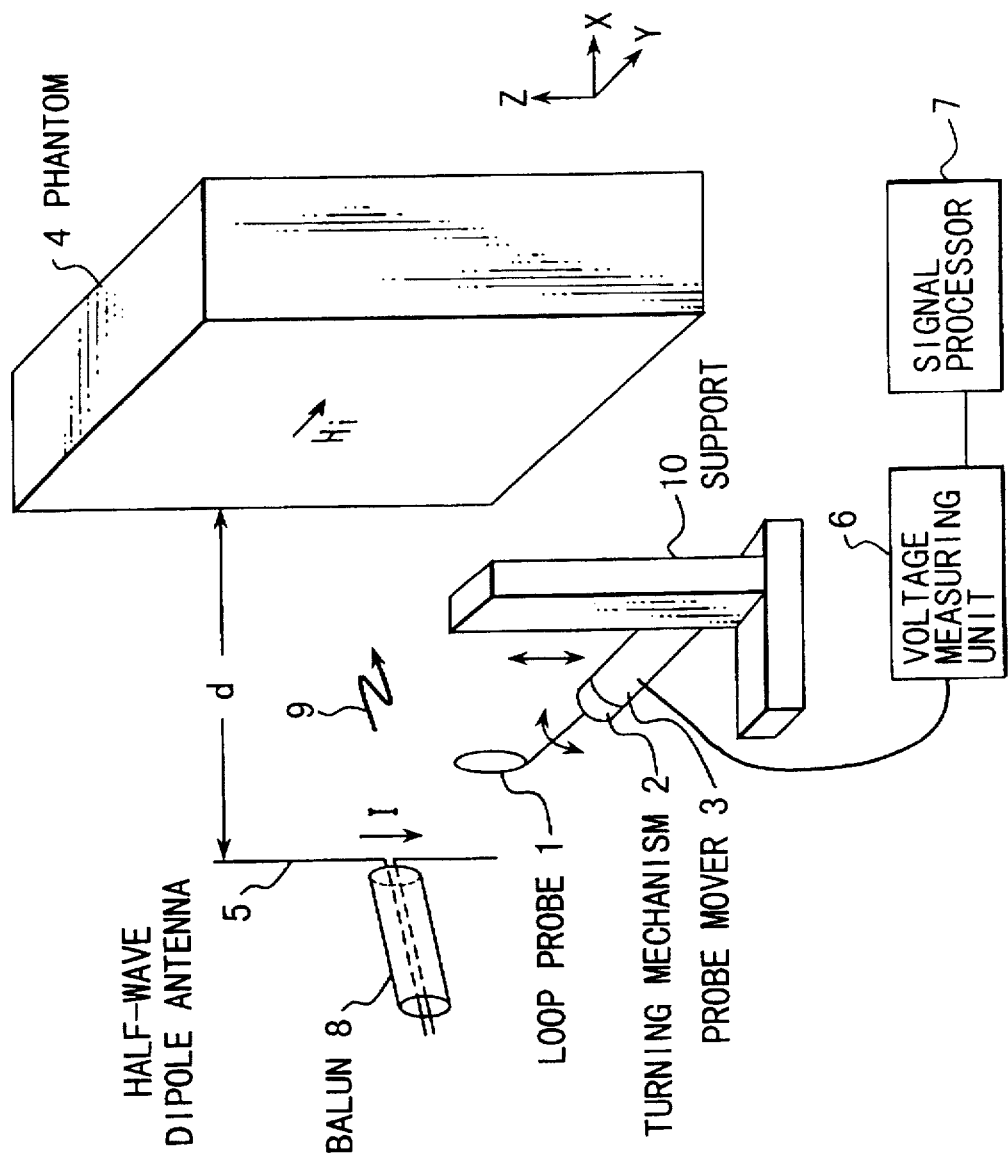
FIG. 3 is a schematic perspective view showing a measuring method of the SAR according to a first embodiment of the present invention.
Figure 4:
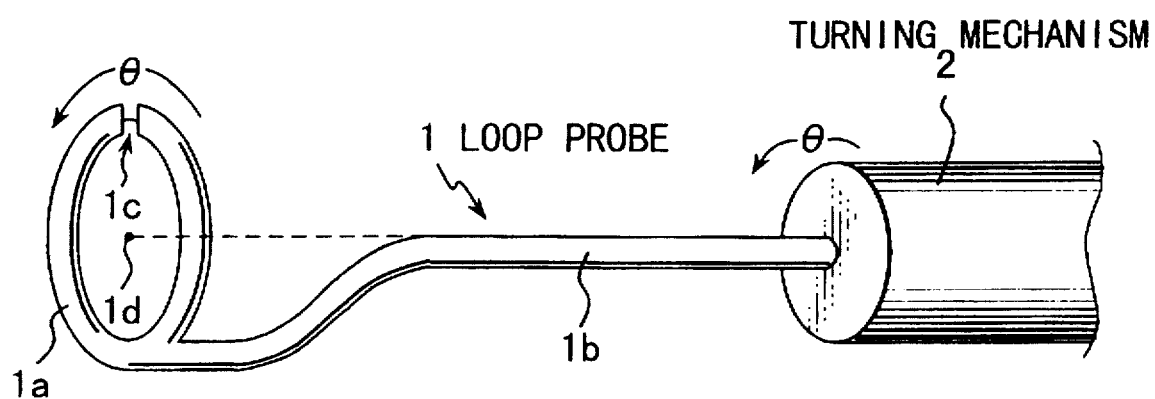
FIG. 4 is a schematic, partial perspective view showing the configuration of the loop probe used in the measuring method according to the first embodiment of FIG. 3.

The measuring method of the SAR according to the first embodiment is performed with the use of a measuring device as shown in FIGS. 3 and 4. The measuring device has a loop probe 1, a probe turning mechanism 2, a probe mover 3, a probe support 10, a voltage measuring unit 6, and a signal processor 7.

The loop probe 1 is fixed to the probe support 10 through the probe turning mechanism 2 and the probe mover 3. The probe 1 can be freely moved in a vertical direction (i.e., along the Z-axis) by the probe mover 3. Also, the probe 1 can be freely turned around the longitudinal axis of the mover 3 by the turning mechanism 2.

The output end of the probe 1 is connected to the voltage measuring unit 6. The output voltage of the unit 6 is supplied to the signal processor 7, in which the magnetic field strength and the antenna current distribution are calculated, and the SAR is evaluated.

As shown in FIG. 4, the loop probe 1 is a shielded loop probe having a looped receiving member 1a, and an elongated supporting member 1b. The receiving member 1a is fixed to the top end of the supporting member 1b. The bottom end of the supporting member 1b is fixed to the probe turning mechanism 2. A gap 1c is formed in the looped receiving member 1a.

The loop probe 1 shown in FIGS. 3 and 4 is a known probe that was disclosed in the article, IEEE Transactions on Antennas and Propagation, vol. AP-21, No. 4, p. 446 to 460, July 1973, written by John D. Dyson, entitled "Measurement of Near Fields of Antennas and Scatters". The probe 1 is made of a semi-rigid cable. The looped receiving member 1a of the probe 1 is bent and folded by approximately 90° so that the center 1c of the loop plane is aligned with the supporting member 1b. In other words, the angle between the receiving member 1a and the supporting member 1b is approximately 90°. The probe 1 can be turned in a direction of θ about the loop center 1d by the probe turning mechanism 2.

Next, the measuring method of the SAR according to the first embodiment will be described below, which is performed by using the above-described measuring device.

As shown in FIG. 3, here, as a transmission antenna, a half-wave dipole antenna 5 of 17 cm in element length is used. The antenna 5 is loaded with a bazooka-shaped balun 8.

For a phantom 4 as a simulated biological body having electrical constants (such as a dielectric constant or the like) equal to those of the human body, a model having a shape like an approximately flat plate is placed near the antenna 5. The characteristics of the phantom 4 at a frequency of 900 MHz are a specific dielectric constant of 41.1, a conductivity of 0.88 S/m, and a mass density of 2.4 g/cm$^3$.

Here, the antenna 5 is supplied with a power of approximately 0.5 mW.

Figure 7:
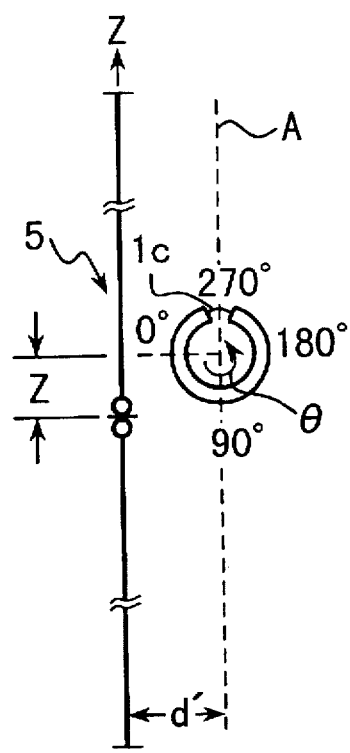
FIG. 7 is a schematic view showing the layout of the probe and the antenna in the measuring method according to the first embodiment.

To measure the strength of the magnetic field H irradiated by the antenna S, as shown in FIG. 7, the loop probe 1 is moved along the line A parallel to the Z-axis from one end of the antenna 5 to the other end while the probe 1 is apart from the antenna 5 by the distance d' and the angle (or gap angle) of the gap 1c of the looped receiving member 1a is kept at 270° with respect to the antenna 5, where d=4 cm. The total length of the antenna 5 is 17 cm and therefore, the value of Z varies from −8.5 to +8.5.

Figure 8:
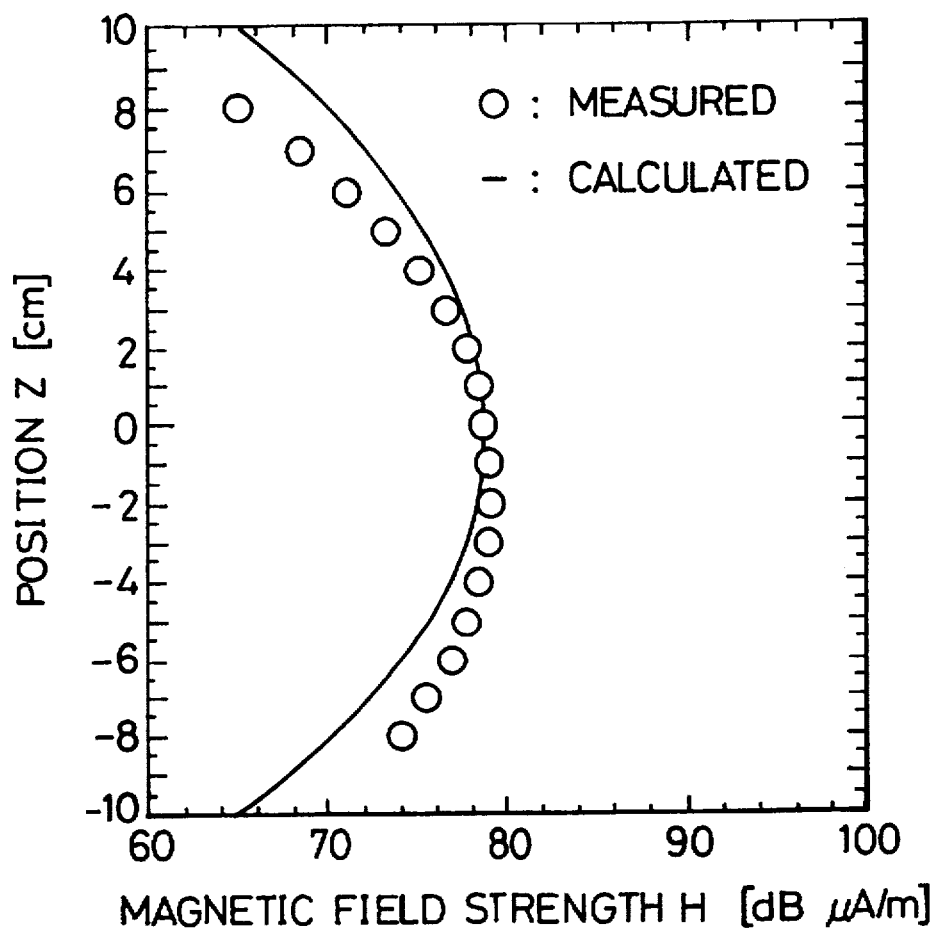
FIG. 8 is a graph showing the relationship between the magnetic field strength and the position of the antenna in the measuring method according to the first embodiment.

The strength of the magnetic field H thus determined is shown with circular marks in FIG. 8. The curved solid line shown in FIG. 8 represents the calculated values of the strength of the magnetic field that is produced by a current with a sinusoidal distribution that flows through the antenna 5.

With a half-wave dipole antenna, typically, the magnetic field distribution is symmetrical with respect to the driving point where the antenna position Z=0 cm. However, it is seen from the plots shown with the circular marks in FIG. 8 that the magnetic field distribution is asymmetrical with respect to the driving point. It can be supposed that this mismatch is caused by the fact that the loop probe 1 simultaneously receives not only the magnetic field but also the electric field due to the geometric asymmetry of the probe 1.

Then, to search the effect of the electric field, the change in the probe voltage V as a function of the gap angle θ is examined at the proximity $P_A$ of the feeding point (Z=0 cm) where the magnetic field is strong and at the proximity $P_B$ of the end of the antenna (Z=8 cm) where the electric field is relatively strong.

Figure 9:
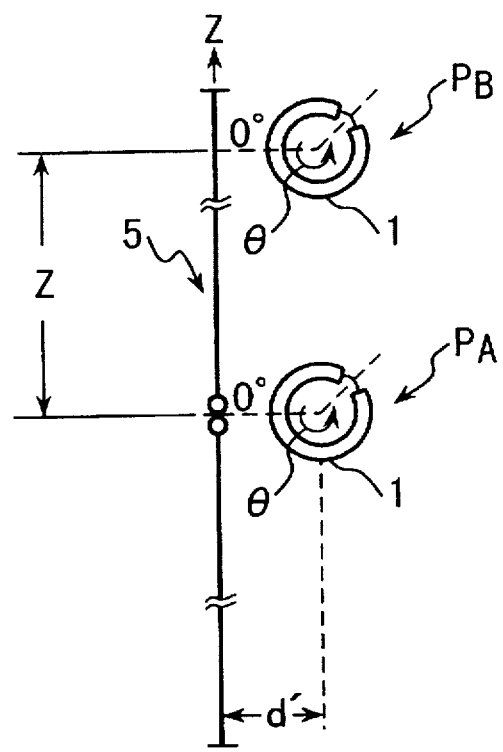
FIG. 9 is a schematic view showing the layout of the probe and the antenna for compensation of the electric field in the method according to the first embodiment.

FIG. 9 shows this examination method. As shown in FIG. 9, the loop probe 1 is turned by the probe turning mechanism 2 in increments of a gap angle of 30 degree of the loop probe 1 at each of the measuring points $P_A$ and $P_s$.

FIG. 10 shows the relationship between the gap angle θ and the probe voltage V thus determined. It is seen from FIG. 10 that the characteristic in the proximity $P_A$ of the feeding point is such that the probe voltage V is approximately constant, as represented by white triangular marks, and therefore, the effect of the electric field can be neglected.

On the other hand, the characteristic in the proximity Pa of the end of the antenna 5 is such that the probe voltage V depends upon the gap angle θ, as represented by black triangular marks in FIG. 10.

Then, to compensate for the effect of the electric field, the strength of the magnetic field H in the proximity $P_B$ is found from the mid-point voltage $V_h$ between the maximum and minimum values of the probe voltage V, i.e., $V_h=(\frac{1}{2})(V_{max}+V_{min})$. The magnetic field distribution after such a compensation is shown with black circular marks in FIG. 11. It is seen from FIG. 11 that this compensated magnetic field distribution coincides with the magnetic field distribution obtained by calculation.

Through the above-described processes, the distribution of the magnetic field irradiated by the antenna 5 is obtained.

Next, the current distribution of the antenna 5 is found in the following way.

Figure 5:
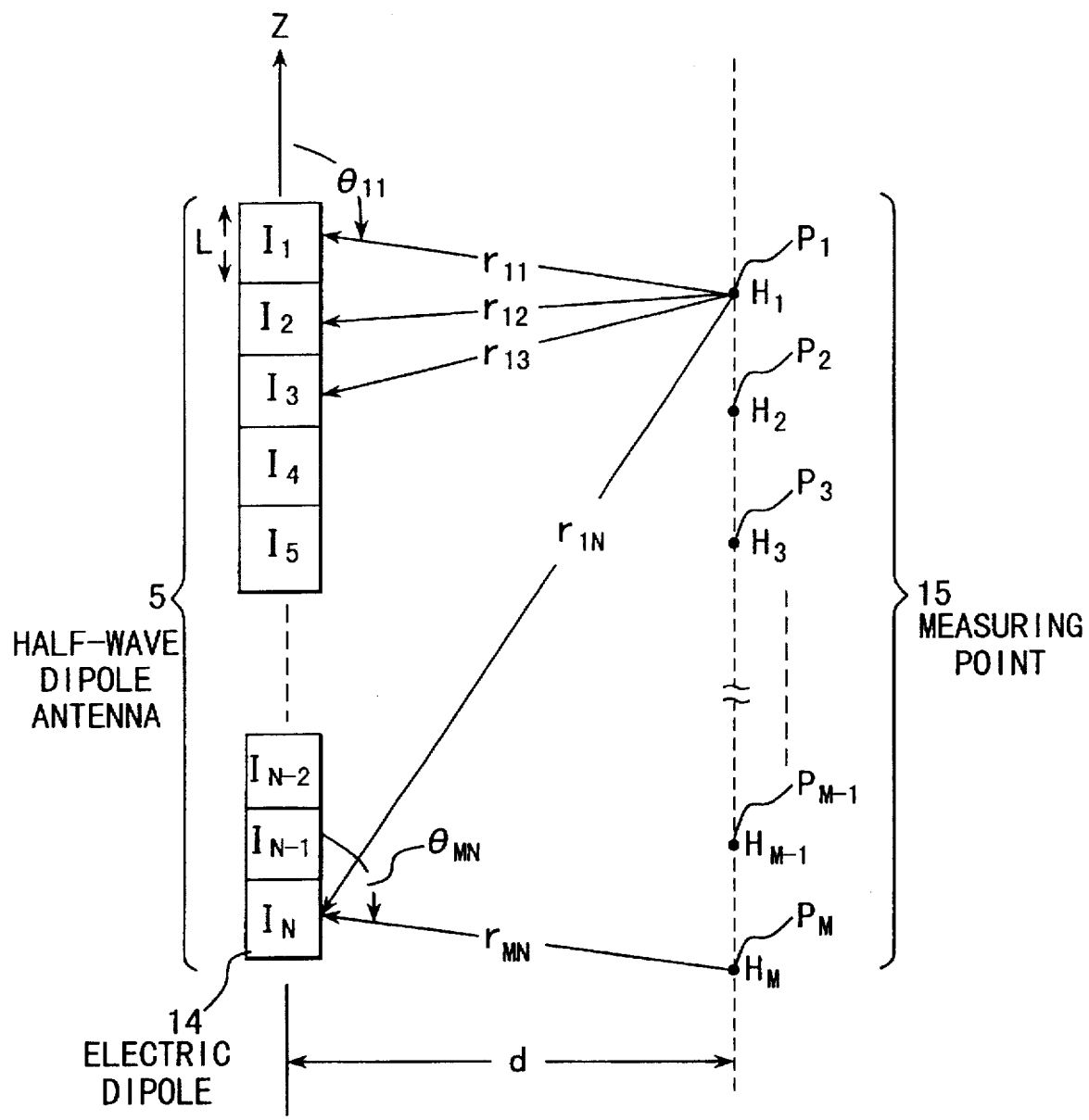
FIG. 5 is a schematic view explaining the method of calculating the current distribution of the antenna in the measuring method according to the first embodiment.

As shown in FIG. 5, it is assumed that the half-wave dipole antenna 5 is made of a group of N minute electric dipoles (or segments) 14, and that the antenna current is a group of minute dipole currents $I_i$ (i=1 to N) flowing through the corresponding dipoles 14. Further, the measuring point 15 is denoted by $P_j$(j=1 to M), the radiation magnetic field at the measuring points $P_j$ is denoted by $H_j$, and the distance between the measuring point 15 and the antenna 5 is d.

The magnetic field $H_{ji}$ at the measuring point $P_j$ that is radiated by the minute dipole current $I_i$ can be expressed by the following equation.

$$H_{ji} = \frac{I_i \cdot L}{4\pi} k_0^2 \cdot \exp(-jk_0 \cdot r_{ji}) \left\{ \frac{1}{(k_0 r_{ji})^2} + \frac{1}{k_0 r_{ji}} \right\} \cdot \sin\theta_{ji} \quad (5)$$

where $r_{ji}$ is the distance between the measuring point $P_j$ and the minute dipole current $I_i$; θ is the angle formed by Z-axis and the $r_{ji}$ vector, L is the length of the minute segments or dipoles 14, $k_o$ is $2\pi/\lambda$ where λ is the wavelength, and $j=(-1)^{1/2}$.

Therefore, the radiated magnetic field $H_j$ at the measuring point $P_j$ is expressed by superposition of the magnetic fields $H_{ji}$ radiated from the minute dipole currents $I_1, I_2, I_3, \ldots,$ and therefore, it is expressed by the following equation (6).

$$H_j = \sum_{i=1}^{N} H_{ji} \quad (6)$$

The equation (6) is rewritten to the following equation (7) in the matrix form.

$$\begin{bmatrix} H_1 \\ H_2 \\ H_3 \\ \cdot \\ \cdot \\ \cdot \\ H_M \end{bmatrix} = \begin{bmatrix} A_{11} & A_{12} & A_{13} & \ldots & A_{1N} \\ A_{21} & A_{22} & A_{23} & \ldots & A_{2N} \\ A_{31} & A_{32} & A_{33} & \ldots & A_{3N} \\ \cdot & \cdot & \cdot & & \cdot \\ \cdot & \cdot & \cdot & & \cdot \\ \cdot & \cdot & \cdot & & \cdot \\ A_{M1} & A_{M2} & A_{M3} & \ldots & A_{MN} \end{bmatrix} \begin{bmatrix} I_1 \\ I_2 \\ I_3 \\ \cdot \\ \cdot \\ \cdot \\ I_N \end{bmatrix} \quad (7)$$

In the equation (7), the coefficients $A_{ji}$ are given by the following expression (8).

$$A_{ji} = \frac{L}{4\pi} k_0^2 \cdot \exp(-jk_0 \cdot r_{ji}) \cdot \left\{ \frac{1}{(k_0 r_{ji})^2} + \frac{1}{k_0 r_{ji}} \right\} \cdot \sin\theta_{ji} \quad (8)$$

Figure 11:
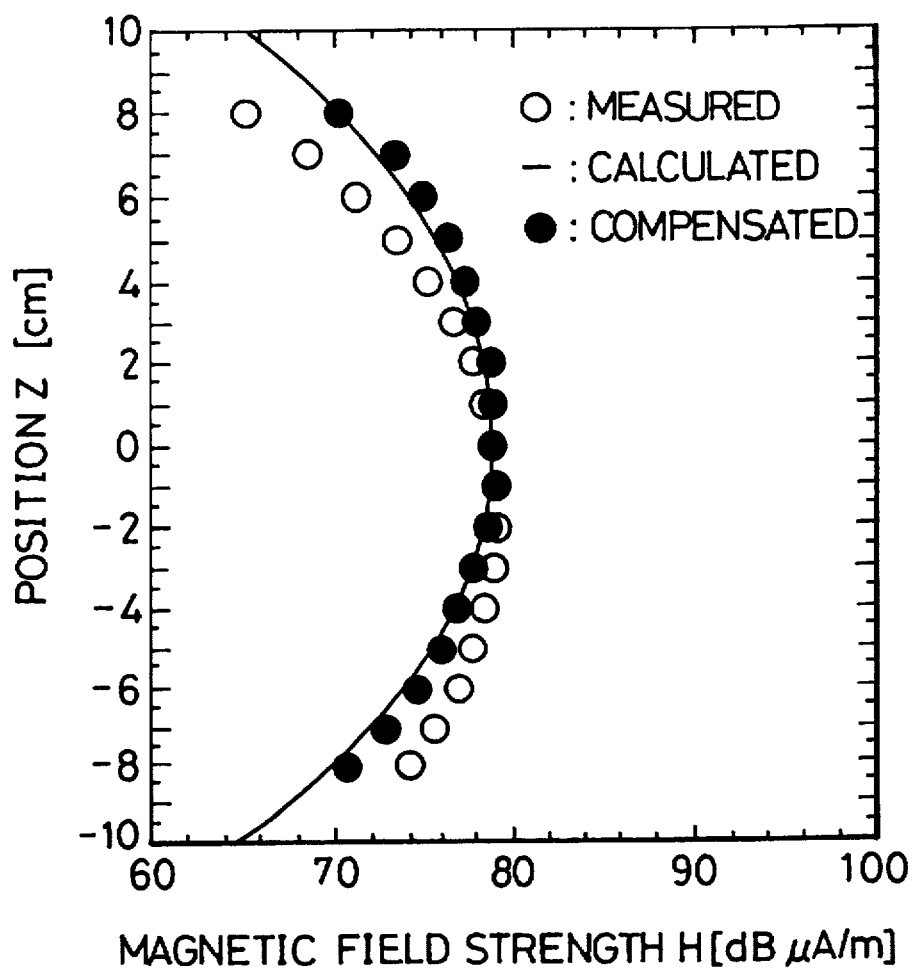
FIG. 11 is a graph showing the relationship between the compensated magnetic field strength and the position of the antenna in the measuring method according to the first embodiment.

As the radiated magnetic fields $H_1, H_2, H_3, \ldots, H_m$, the plots of the magnetic field strength shown in FIG. 11 can be used. The coefficients $A_{ji}$ can be calculated by using the expression (8), where the first term in the matrix (7) on the right-hand side is QR-decomposed by using the modified Gram-Schmidt method. Therefore, the dipole currents $I_1, I_2, I_3, \ldots, I_N$ can be analyzed by the equation (7), in which the method of least squares is used.

Figure 12:
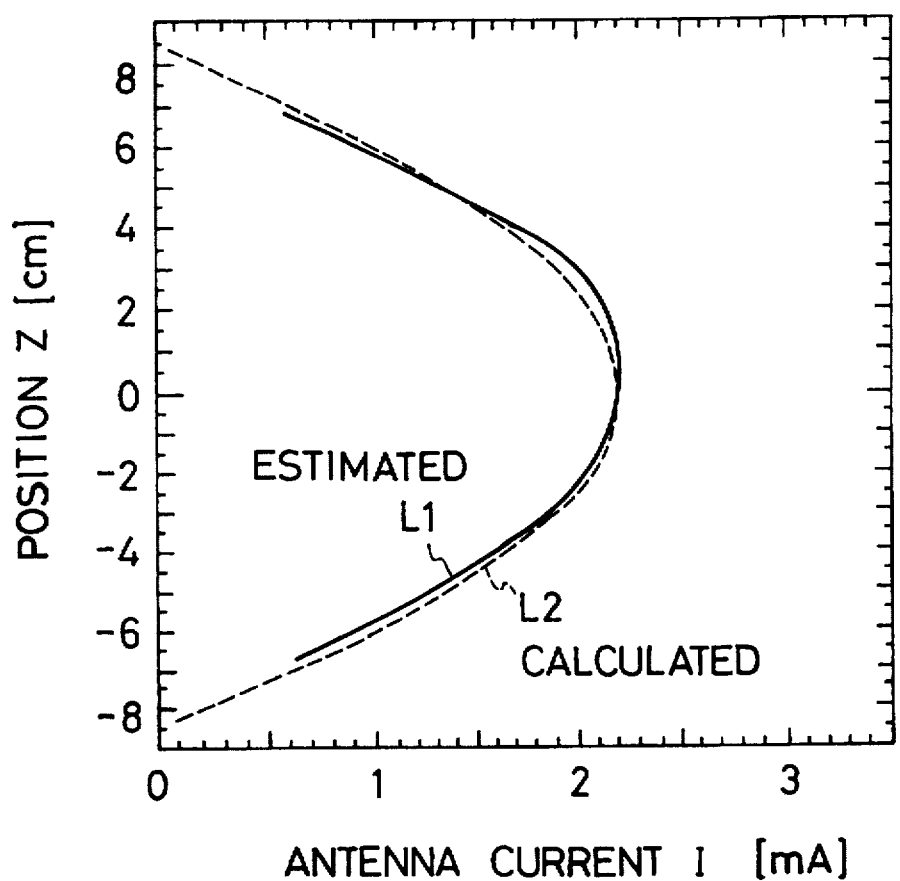
FIG. 12 is a graph showing the relationship between the antenna current and the position of the antenna in the measuring method according to the first embodiment.

Through the above processes, the dipole currents $I_1, I_2, I_3, \ldots, I_N$ are obtained, in other words, the current distribution of the antenna 5 is found. FIG. 12 shows the estimated current distribution of the antenna 5 as a function of the position Z of the antenna 5. In FIG. 12, the solid line L1 represents the estimated distribution, which is well approximate to the λ/2 distribution represented by the dotted line L2. Thus, it is seen that the determining method of the present invention is valid.

Subsequently, the distribution of the incident magnetic field on the surface of the phantom 4 is found by calculation. This calculation is made by substituting the analyzed values of the minute dipole currents $I_1, I_2, I_3, \ldots, I_N$ into the equations (5) and (6).

Finally, by substituting the distribution of the incident magnetic field thus found into the equation (1), the SAR of the phantom 4 is obtained.

Figure 6:
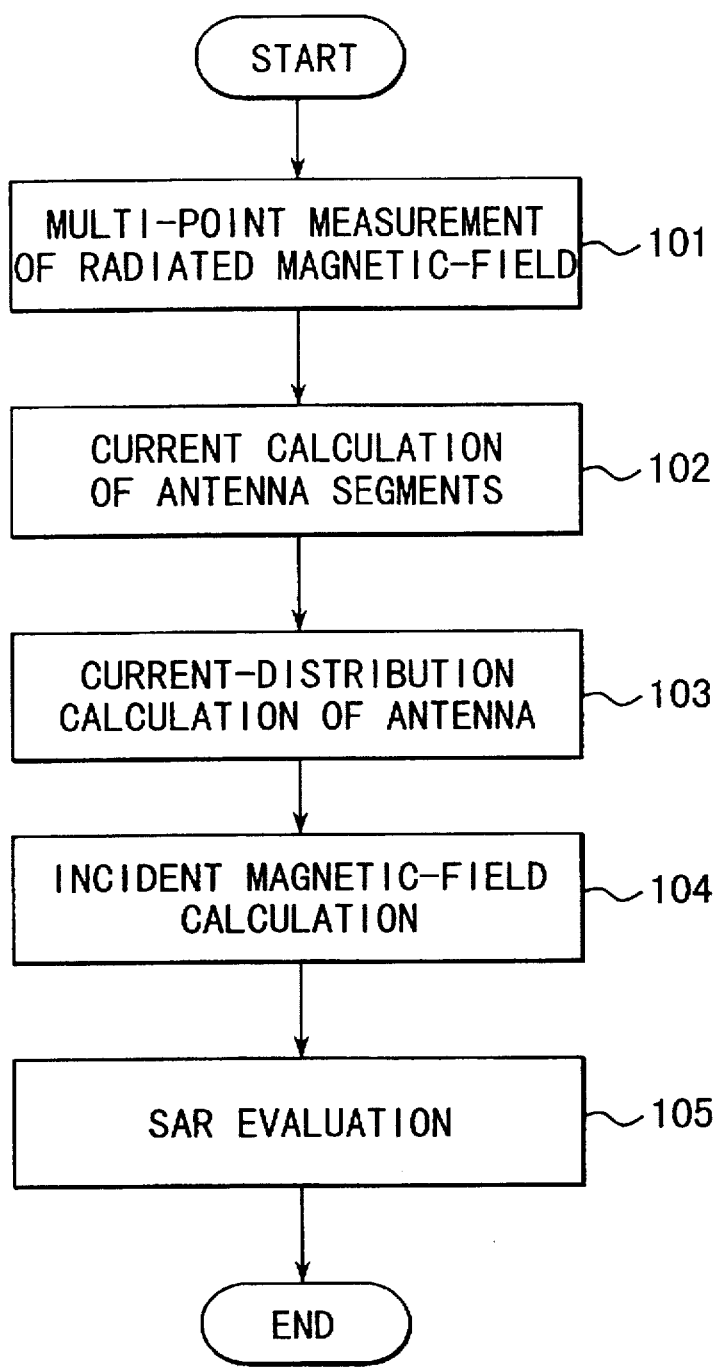
FIG. 6 is a flowchart showing the measuring method according to the first embodiment.

FIG. 6 shows the flowchart of the above-described measuring method according to the first embodiment. In summary, the radiated magnetic field from the antenna 5 is measured at different points, which may be termed the "multi-point measurement" in the step 101. Then, the currents flowing through the antenna segments or minute dipoles 14 are calculated in the step 102. Using the calculated values of the currents of the antenna segments or minute dipoles 14, the current distribution of the antenna 5 is then calculated in the step 103. The incident magnetic field on the surface of the phantom 4 is calculated by using the antenna current distribution in the step 104. Finally, the SAR is obtained using the calculated incident magnetic field and then evaluated in the step 105.

Next, the compensation or solution of the problem due to the reflection of the radiated magnetic field will be described below.

Figure 13:
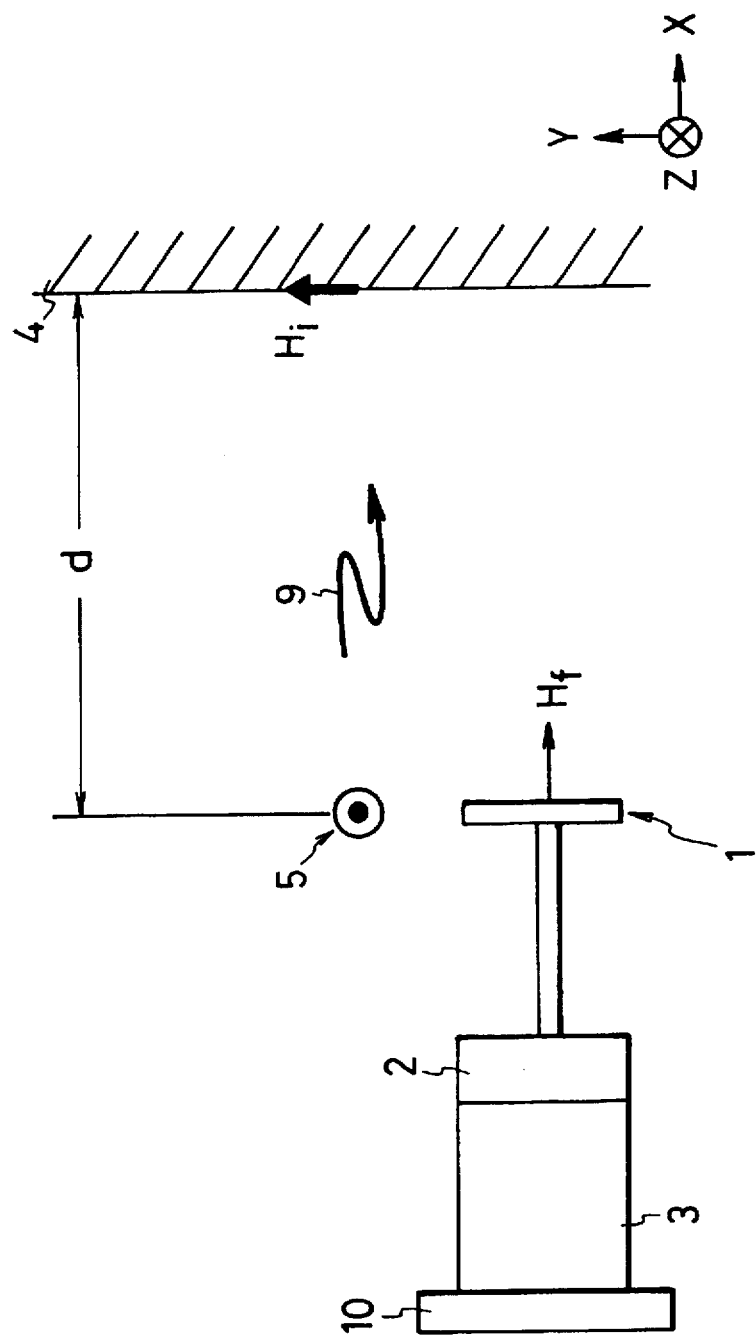
FIG. 13 is a schematic view showing the location of the probe, the antenna, and the phantom in the measuring method according to the first embodiment, in which the radiated magnetic field is measured.

When measuring the radiated magnetic field $H_f$ from the antenna 5 in the step 101, the probe 1 is placed to be parallel to the surface of the phantom 4, as shown in FIG. 13.

On the other hand, as previously stated, when the phantom 4 is brought near to the antenna 5, the effect of the magnetic field reflected on the surface of the phantom 5 causes a problem for measurement. This phenomenon was confirmed by the inventor of the present invention, which was explained in the Japanese Non-Examined Patent Publication No. 8-94544 published in April, 1996.

Figure 14:
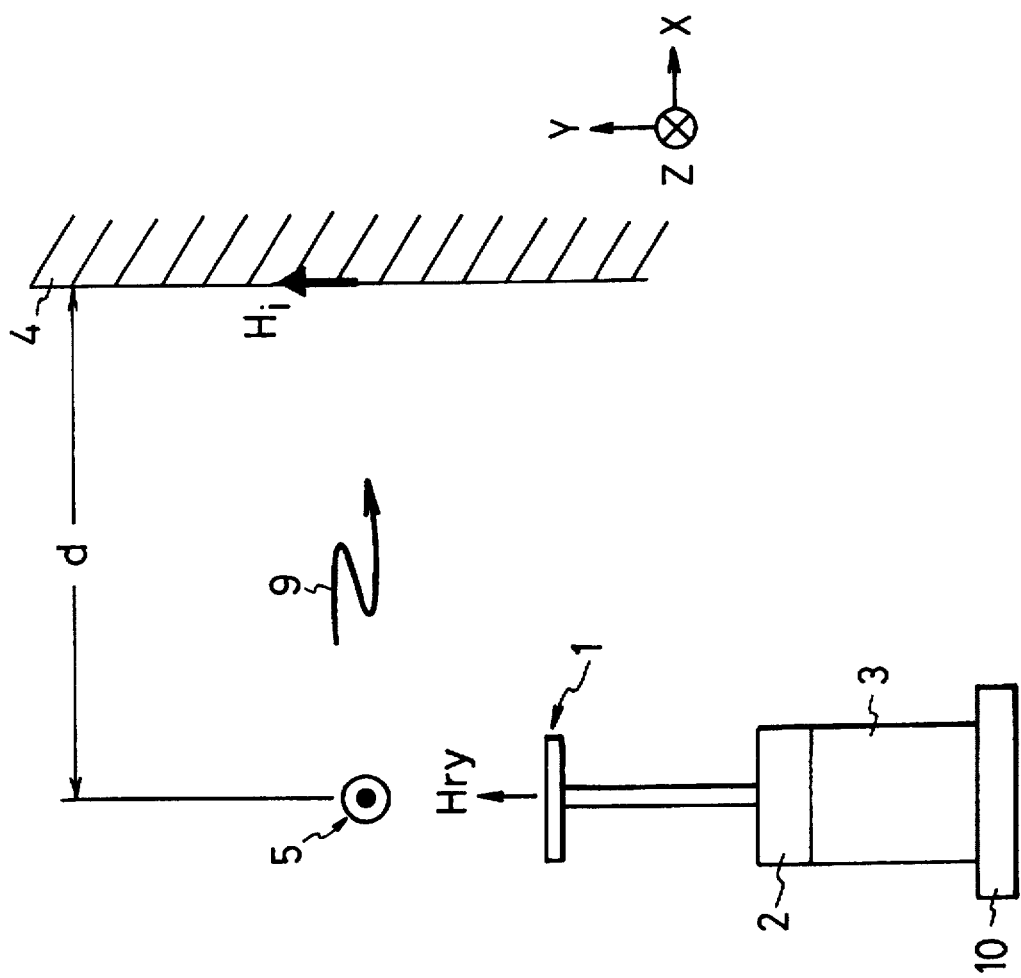
FIG. 14 is a schematic view showing the location of the probe, the antenna, and the phantom in the measuring method according to the first embodiment, in which the reflected magnetic field by the phantom is measured.

Then, as shown in FIG. 14, the loop plane of the probe 1 is positioned to be normal to the surface of the phantom 4 at the same position where the radiated magnetic field $H_r$ is measured (see FIG. 13), thereby measuring the Y component $H_{ry}$ of the reflected magnetic field. The radiated magnetic field $H_r$ is then compensated with the use of the measured reflected magnetic field $H_{ry}$. Thus, the compensated magnetic field strength is obtained, as shown in FIG. 15.

Figure 15:
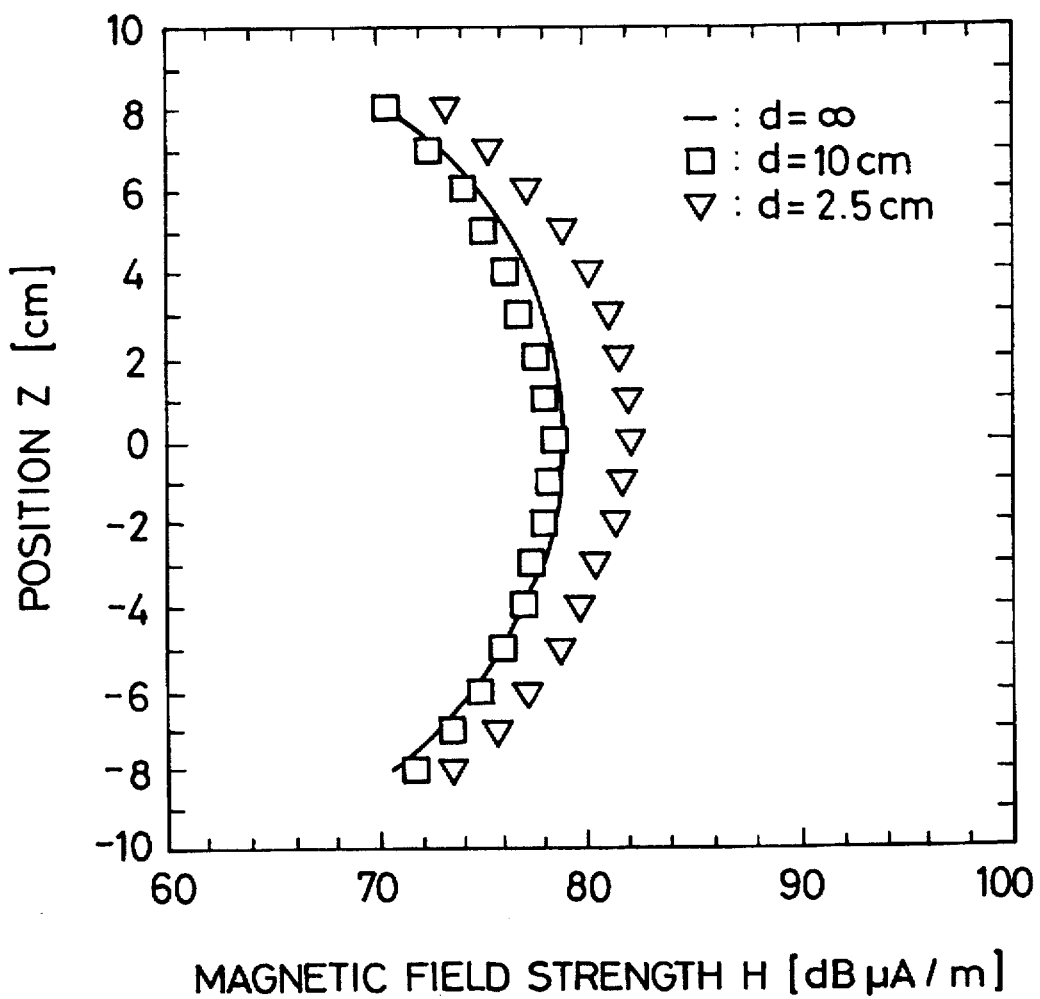
FIG. 15 is a graph showing the relationship between the compensated magnetic field strength and the position of the antenna in the measuring method according to the first embodiment.

In FIG. 15, when the distance d is 10 cm or so, the magnetic field distribution in the vicinity of the antenna 5 represented by white square marks approximately coincides with the characteristic given without the phantom 4 that is represented with a solid line. On the other hand, with the magnetic field distribution when the distance d is 2.5 cm, the radiated magnetic field strength is increased as shown with white triangular marks. It is supposed that this increase is caused by the effect of the "mutual coupling" generated by approaching the phantom 4 to the antenna 5 to thereby change the impedance of the antenna 5.

As a result, by using the compensated magnetic field, it is found that the SAR of the phantom 4 for a spacing of d=2.5 cm is approximately 1.34 mW/kg, and that for d=10 cm is approximately 0.04 mW/kg.

With the measuring method according to the first embodiment of the present invention, the magnetic field $H_r$ radiated from the antenna 5 and the magnetic field generated by reflection of the radiated magnetic field on the surface of the phantom 4 can be separately measured by using the probe 1. Also, the processor 7 is able to calculate the compensated magnetic field, the current distribution of the antenna 5, and the strength of the incident magnetic field by using the measured values of these two magnetic fields.

Accordingly, the SAR on the surface of a human body is able to be measured with high accuracy when the human body is in the vicinity of the antenna 5.

SECOND EMBODIMENT

FIG. 16 shows a measuring method according to a second embodiment of the present invention.

In the measuring method according to the first embodiment shown in FIGS. 1 to 15, the turning mechanism 2 for the loop probe 1 is provided, and the probe 1 is turned by 90° between the measurements of the radiated magnetic field itself and the reflected magnetic field.

On the other hand, in the measuring method according to a second embodiment, a plurality of orthogonal loop probe units 11 are used instead of the probe 1. The plurality of probe units 11 are arranged along a straight line to thereby form a probe array. The second embodiment is preferred for the case where the probe 1 is prevented from being affected by the electric field by, for example, eliminating the asymmetry in the magnetic field due to the loop gap 1c of the probe 1

In the method according to the second embodiment, as shown in FIG. 16, the plurality of orthogonal loop probe units 11 arranged linearly are used to measure the radiated magnetic field. Each of the probe units 11 has two loop probes 12 and 13 combined so that they orthogonally intersect with each other.

The loop plane of the probe 12 is positioned in parallel to the surface of the phantom 4, while that of the probe 13 is positioned normally to the surface of the phantom 4 in FIG. 16.

The probes 12 and 13 allow the orthogonally intersecting two-directional magnetic fields to be measured simultaneously, and thus compensation for the reflected magnetic field can be made at each measuring point. Therefore, the current distribution of the antenna 5 can be readily estimated for evaluation of the SAR.

The measuring method of the SAR according to the first and second embodiments are able to estimate the current distribution of the antenna 5 in such applications as those where the antenna current distribution is not changed by the phantom approach, where the antenna current is intricately distributed, and where the current distribution is asymmetrical with respect to the feeding point.

As the phantom 4, such a phantom as a spherical one, an elliptic cylindrical one, and a cylindrical one prepared in consideration of the human head and the human body can be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method for measuring the Specific Absorption Rate (SAR) of electric power comprising the steps of:

(a) preparing a probe for receiving at least one of two orthogonally-intersecting magnetic fields;

(b) providing a simulated biological body having approximately the same dielectric constant and approximately the same permeability as those of a human body;

(c) separately measuring a first magnetic field radiated from an antenna and a second magnetic field generated by reflection of said first magnetic field on the surface of said simulated biological body at various measuring points between said antenna and said simulated biological body by using said probe;

(d) calculating a compensated magnetic field using the measured values of said first and second magnetic fields in said step (c);

(e) determining a current distribution of said antenna by using the calculated values of said compensated magnetic field, based on a combination of each of a plurality of dipole currents flowing through a plurality of segments of said antenna, said segments serving as minute electric dipoles;

(f) calculating the strength of an incident magnetic field on the surface of said simulated biological body by using the calculated current distribution of said antenna; and (g) evaluating the SAR using the calculated value of the strength of said incident magnetic field and a distance between said antenna end said simulated biological body.

2. A measuring method as claimed in claim 1, wherein said probe is a loop probe having a looped receiving member for receiving said first and second magnetic fields and an elongated supporting member for supporting said receiving member;

and wherein said receiving member has a gap;

and wherein the angle between said receiving member and said supporting member is approximately 90°;

and wherein said receiver member can be turned around the center of said looped receiving member.

3. A measuring method as claimed in claim 1, wherein said probe is a unit including a first looped receiving member for receiving said first magnetic field and a second looped receiving member for receiving said second magnetic field;

and wherein the angle between said first and second receiving members is approximately 90°.

4. A measuring method as claimed in claim 1, wherein said probe is an array of probe units arranged along a straight line;

and wherein each of said probe units includes a first looped receiving member for receiving said first magnetic field and a second looped receiving member for receiving said second magnetic field;

and wherein the angle between said first and second receiving members is approximately 90°.

5. A device for measuring the Specific Absorption Rate (SAR) of electric power comprising:

(a) a probe positioned between an antenna and a simulated biological body for receiving at least one of two orthogonally-intersecting magnetic fields;

said probe serving to separately measure a first magnetic field radiated from said antenna and a second magnetic field generated by reflection of said first magnetic field on the surface of said simulated biological body, thereby outputting first and second output signals;

said first output signal corresponding to said first magnetic field and said second output signal corresponding to said second magnetic field; and (b) a signal processor;

said signal processor having functions of;

receiving said first and second output signals to calculate a compensated magnetic field using the measured values of said first and second magnetic fields, calculating a current distribution of said antenna using the calculated values of said compensated magnetic field, calculating the strength of an incident magnetic field on the surface of said simulated biological body by using the calculated current distribution of said antenna, and evaluating the SAR using the calculated value of the strength of said incident magnetic field and a distance between said antenna and said simulated biological body.

6. A measuring device as claimed in claim 5, wherein said probe is a loop probe having a looped receiving member for receiving said first and second magnetic fields and an elongated supporting member for supporting said receiving member;

and wherein said receiving member has a gap;

and wherein the angle between said receiving member and said supporting member is approximately 90°;

and wherein said receiving member can be turned around the center of said looped receiving member.

7. A measuring device as claimed in claim 5, wherein said probe is a unit including a first looped receiving member for receiving said first magnetic field and a second looped receiving member for receiving said second magnetic field;

and wherein the angle between said first and second receiving members is approximately 90°.

8. A measuring device as claimed in claim 5, wherein said probe is an array of units arranged along a straight line;

and wherein each of said units includes a first looped receiving member for receiving said first magnetic field and a second looped receiving member for receiving said second magnetic field;

and wherein the angle between said first and second receiving members is approximately 90°.

9. A measuring device as claimed in claim 5, further comprising a probe mover and a prove turning mechanism;

wherein said probe mover serves to move said probe along the surface of said phantom;

and wherein said prove turning mechanism serves to turn said probe around the center of the loop plane.

* * * * *